(12) United States Patent
Lin et al.

(10) Patent No.: US 12,249,960 B2
(45) Date of Patent: Mar. 11, 2025

(54) ACTIVE BALUN DESIGN

(71) Applicant: Analog Devices, Inc., Wilmington, MA (US)

(72) Inventors: Song Lin, Lexington, MA (US); Xudong Wang, Colorado Springs, CO (US); Jinzhou Cao, Hillsboro, OR (US); Christopher Eugene Hay, Colorado Springs, CO (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 18/300,069

(22) Filed: Apr. 13, 2023

(65) Prior Publication Data
US 2024/0056031 A1 Feb. 15, 2024

Related U.S. Application Data

(60) Provisional application No. 63/371,456, filed on Aug. 15, 2022.

(51) Int. Cl.
*H03D 7/14* (2006.01)
*H03D 7/12* (2006.01)

(52) U.S. Cl.
CPC .......... *H03D 7/1441* (2013.01); *H03D 7/125* (2013.01); *H03D 2200/0023* (2013.01)

(58) Field of Classification Search
CPC .......... H03H 7/42; H03H 7/425; H03H 11/32; H01P 5/10; H03F 3/26; H03F 3/265; H03F 2200/06; H03F 2200/09; H03D 7/14; H03D 7/1425; H03D 7/1433; H03D 7/1441; H03D 7/1466; H03D 2200/0023
See application file for complete search history.

(56) References Cited

U.S. PATENT DOCUMENTS 11,705,870 B2 * 7/2023 Hue ...................... H03F 1/0288
 330/295
2022/0021343 A1 * 1/2022 Hue ......................... H03F 1/42

FOREIGN PATENT DOCUMENTS

CN 117595832 A 2/2024
DE 102023120774 A1 2/2024

OTHER PUBLICATIONS

Kobayashi, Kevin, et al., "A Novel HBT Distributed Amplifier . Design Topology Based on Attenuation Compensation Techniques", IEEE Transactions on Microwave Theory and Techniques, 42(12), (Dec. 1994), 2583-2589.

* cited by examiner

*Primary Examiner* — Long Nguyen
(74) *Attorney, Agent, or Firm* — Schwegman Lundberg & Woessner, P.A.

(57) ABSTRACT

The present subject matter relates to active balun circuits. An active balun circuit includes a plurality of transistors; an output transmission line connected to output terminals of the transistors; an input transmission line; and a plurality of serial capacitors coupled to an input terminal of the transistors and the input transmission line.

18 Claims, 8 Drawing Sheets

ACTIVE BALUN DESIGN

CLAIM OF PRIORITY

This application claims priority to U.S. Provisional Application Ser. No. 63/371,456, filed Aug. 15, 2022, which is incorporated by reference herein in its entirety.

FIELD OF THE DISCLOSURE

This document pertains generally, but not by way of limitation, to baluns, and more particularly, to an active balun integrated circuit.

BACKGROUND

A balun is used in electronic systems to interface an unbalanced signal line with a balanced signal line. An example application is interfacing a balanced antenna to an unbalanced coaxial transmission line.

Baluns can be active baluns that include active devices (e.g., transistors) or passive baluns that include only passive devices. Passive baluns don't consume power and have good linearity to provide a constant amplitude and phase response as input signal power changes. However, passive baluns are large and bulky for low frequency applications and have high insertion loss for high frequency applications. Passive baluns are limited in their ability to handle high power applications. Also, baluns should match impedances of the balanced and unbalanced lines to avoid reflections. In general, a passive balun design is not flexible enough to use in multiple applications having differing port impedances.

Active baluns are compact in size and have a wider bandwidth than passive baluns. They are also able to handle higher power. However, active baluns need a circuit supply for DC power, and the amplitude and phase response changes with signal power. A preamplifier is often added to active balun designs to compensate for gain loss and to increase bandwidth. This complicates and increases the size of the active balun design.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As explained previously herein, active baluns provide advantages over passive baluns. Among other things, active baluns are more compact in size than passive baluns and have a wider bandwidth. However, active baluns need a circuit supply for DC power, and the amplitude and phase response changes with signal power. However, a preamplifier is often added to active balun circuit designs to compensate for gain loss and to increase bandwidth. Using a preamplifier complicates the circuit design of active baluns and increases the size of an active balun circuit.

Figure 1:
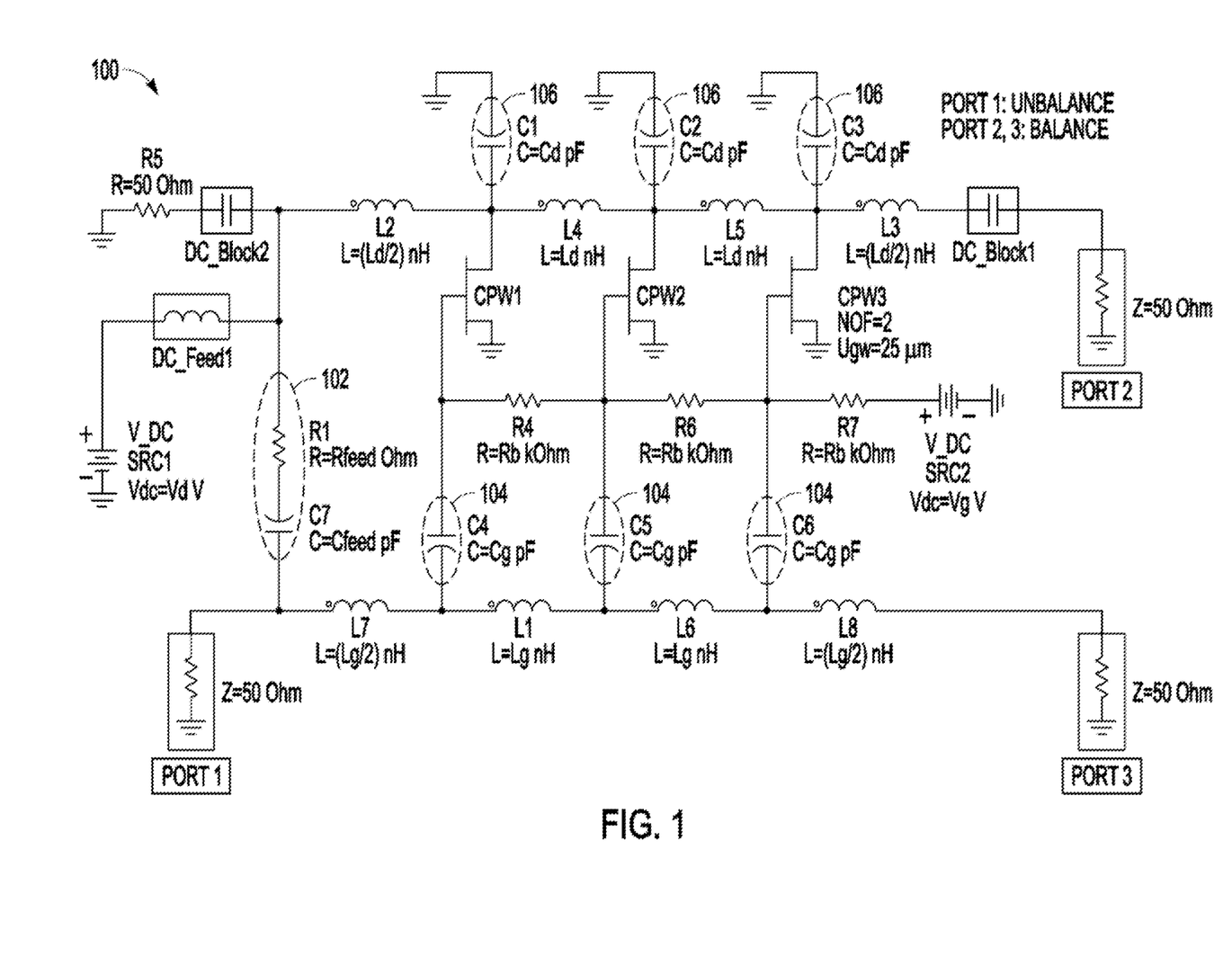
FIG. 1 is a circuit schematic of an example of an active balun circuit.

FIG. 1 is a circuit schematic of an example of an active balun circuit 100. The active balun circuit 100 includes three terminals or ports. An unbalanced signal received at Port 1 is converted to a balanced differential signal at Ports 2 and 3. The signal at Port 2 is 180 degrees out of phase with the signal at Port 1, and the signal at Port 3 is in phase with the signal at Port 1. The example shows a 50 Ohm unbalanced input impedance at Port 1 and a 50 Ohm balanced output impedance at Ports 2 and 3. Other impedances can be used (e.g., 100 Ohms, etc.).

The active balun circuit 100 has a distributed circuit topology. It includes active devices that are transistors and artificial transmission lines denoted as inductors in the schematic. In the example of FIG. 1, the active devices (CPW1, CPW2, CPW3) are field effect transistors (FETs). In another example, the active devices are heterojunction bipolar transistors (HBTs). The transmission line connection to the input terminals of the transistors (e.g., the gate terminals of FETs, or base terminals of HBTs) provides the non-inverting output to Port 3. This input transmission line consists of inductors L7, L1, L6, and L8 connected in series between Port 1 and Port 3. The transmission line connection to the output terminals of the transistors (e.g., the drain terminals of FETs or the collector terminal of HBTs) uses the phase inversion property between the input and output terminals to provide the out of phase inverting output to Port 2. This output transmission line consists of inductors L2, L4, L5, and L3 connected in series between two DC blocking capacitors (DC_Block1, DC_Block2). Inductors L2, L4, L5, and L3 can be presented as a distributed element such as a transmission line as well.

The active balun circuit 100 includes a resistive-capacitive (RC) feedback path 102 connected between the input transmission line and the output transmission line. The RC feedback path 102 is also connected to a DC bias inductor (DC_Feed1) that is connected to a DC voltage source (SRC1). The RC feedback path 102 improves the flatness of the phase and amplitude over the operating frequency range. The active balun circuit 100 also includes serial capacitors 104 (C4, C5, C6) connected to the input terminals of the transistors (CPW1, CPW2, CPW3) and the input transmission line. The serial capacitors 104 improve the amplitude balance, eliminating the need for an additional preamplifier. The serial capacitors 104 attenuate the amplitude of the signal through the active balun circuit 100 to keep the gain flat over the frequency range and provide a flat amplitude response over the frequency operating range.

The active balun circuit 100 includes shunt capacitors 106 (C1, C2, C3) connected between the output transmission line and circuit ground. The shunt capacitors 106 improve the phase and amplitude balance over the frequency operating range. The transistors, RC feedback path 102, serial capacitors 104, shunt capacitors 106, and input and output transmission lines can be fabricated on an integrated circuit (IC). The DC bias inductor (DC_Feed), and DC blocking capacitors (DC_Block1, DC_Block2) can be external to the IC. The external components can be included in a separate IC (e.g., a separate chip or flip chip) or the external components can be included on a circuit board. The low frequency limit of the frequency bandwidth is set by the values of the DC bias inductor and DC blocking capacitors. The high frequency limit of the frequency bandwidth is set by the insertion loss of the input and output transmission lines and the transition frequency Jr of the transistors.

Figure 2:
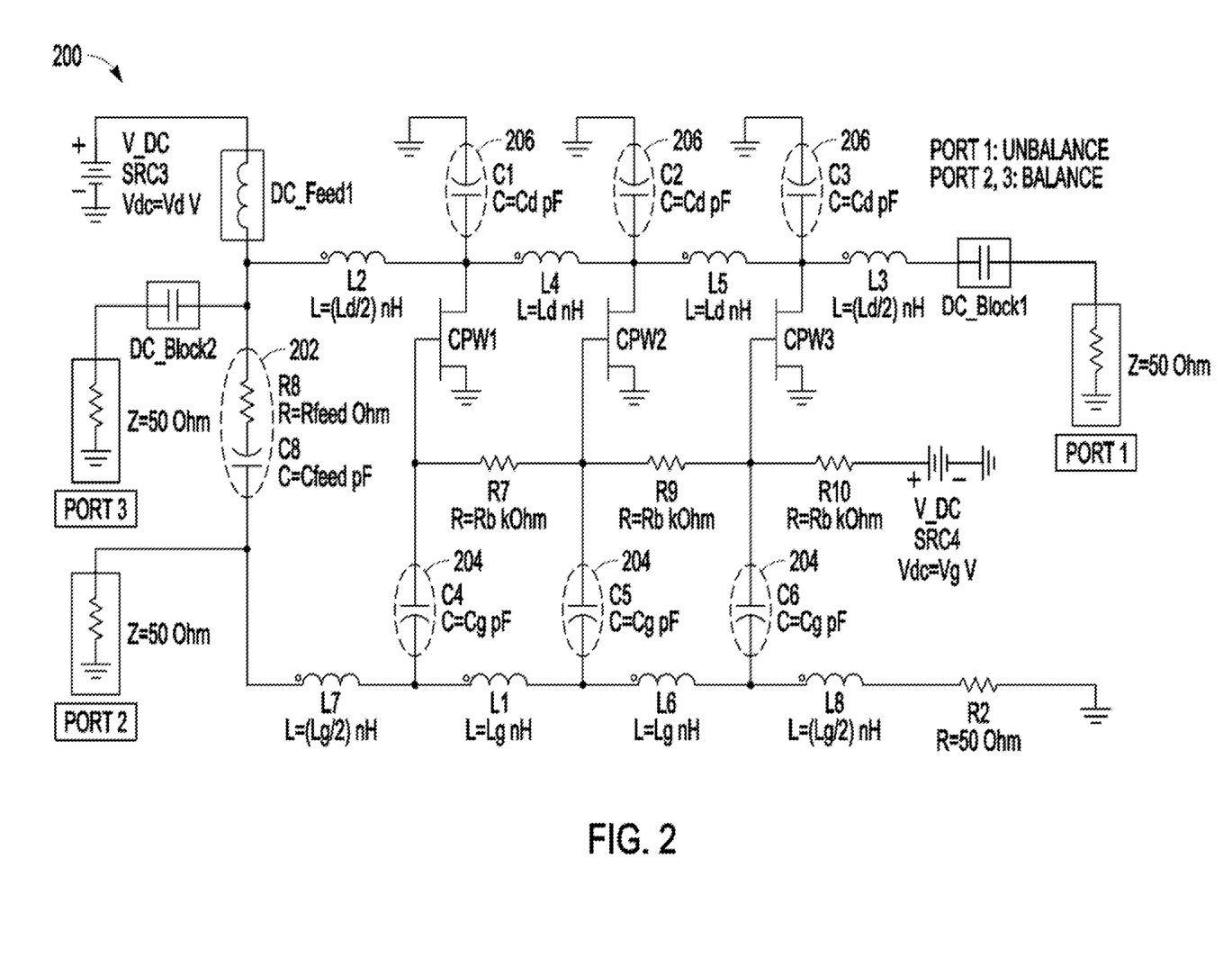
FIG. 2 is a circuit schematic of another example of an active balun circuit.

FIG. 2 is a circuit schematic of another example of an active balun circuit 200. The active balun circuit 200 is used to convert a balanced signal received at Ports 2 and 3 to an unbalanced signal at Port 1. The signal at Port 2 is 180 degrees out of phase with the signal at Port 1, and the signal at Port 3 is in phase with the signal at Port 1. The active balun circuit 200 has a distributed amplifier circuit topology.

The active balun circuit 200 includes active devices (CPW1, CPW2, CPW3), an input transmission line connected to the input of the active devices, and an output transmission line connected to the output of the active devices. The active balun circuit 200 includes an RC feedback path 202 connected to the input transmission line, output transmission line, DC bias inductor (DC_Feed1), and DC blocking capacitor (DC_Block2). As in the example of FIG. 1, the RC feedback path 202 improves the flatness of the phase and amplitude over the operating frequency range. The active balun circuit 200 also includes serial capacitors 204 (C4, C5, C6) connected to the input terminals of the active devices and the input transmission line, and includes shunt capacitors 206 (C1, C2, C3) connected between the output transmission line and circuit ground. The serial capacitors 204 and shunt capacitors 206 improve the phase and amplitude balance over the frequency operating range, and a preamplifier is not needed for the active balun circuit 200 of FIG. 2.

Figure 3:
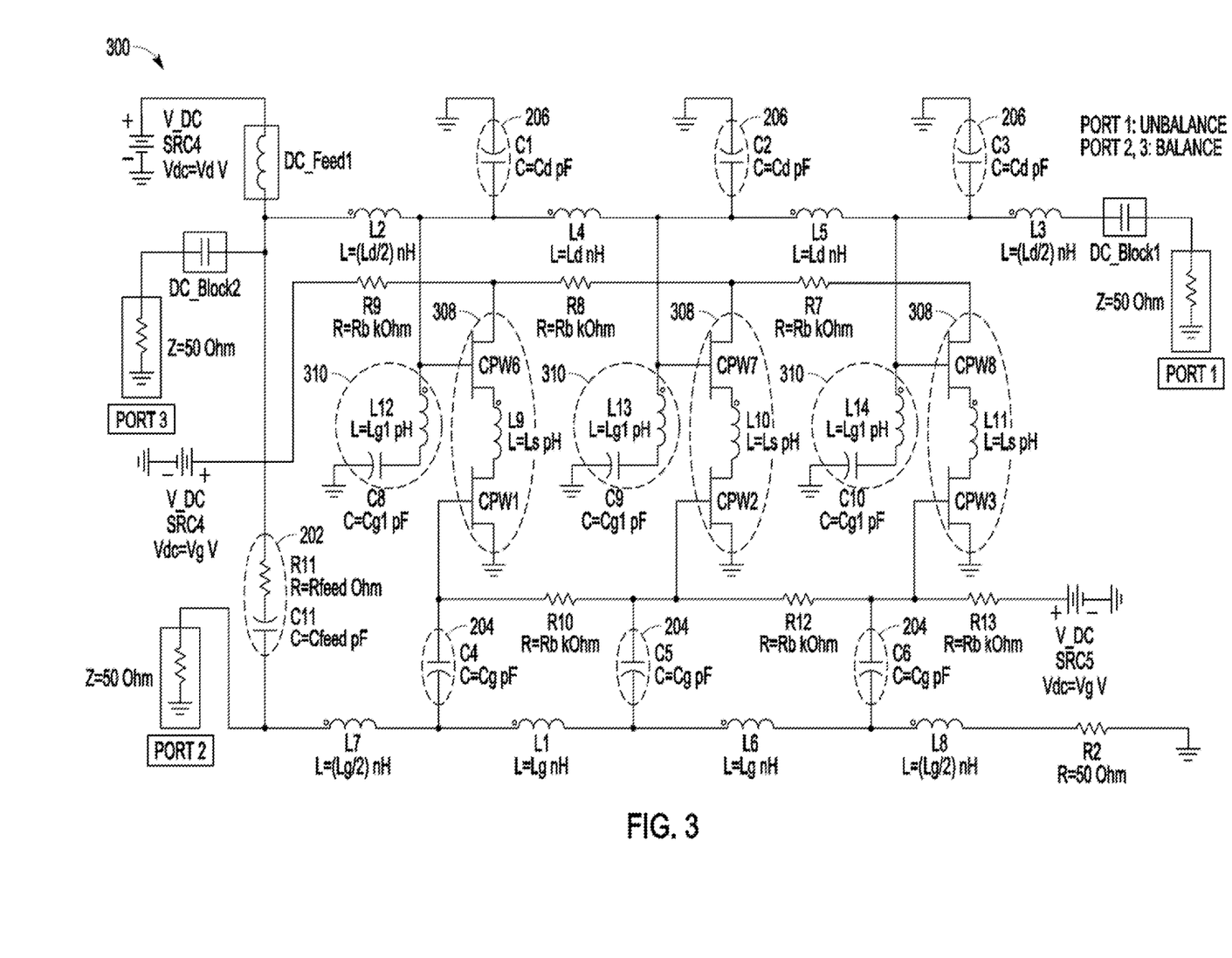
FIG. 3 is a circuit schematic of another example of an active balun circuit.

FIG. 3 is a circuit schematic of another example of an active balun circuit 300. The active balun circuit 300 is used to convert a balanced signal received at Ports 2 and 3 to an unbalanced signal at Port 1. The active balun circuit 300 has a distributed amplifier topology similar to the example of FIG. 2, and includes RC feedback path 202, serial capacitors 204, and shunt capacitors 206. The example in FIG. 3 includes cascode structures 308 containing transistors CPW6, CPW7, CPW8 connected in a cascode arrangement with transistors CPW1, CPW2, CPW3, respectively. In the cascode structures 308, an inductance (L9, L10, L11) is connected between the cascode connected FETs. Inductors L9, L10, L11 can be presented as a distributed element such as a transmission line as well. The cascode circuit structures 308 allow larger RF voltage swing, which improves the one decibel (1 dB) compression point of the frequency response of the active balun circuit 300. The active balun circuit 300 also includes an inductor-capacitor (LC) circuit 310 connected to each of the input terminals of transistors CPW6, CPW7, CPW8. The LC circuits 310 further improve the phase and amplitude balance over the frequency operating range.

Figure 4:
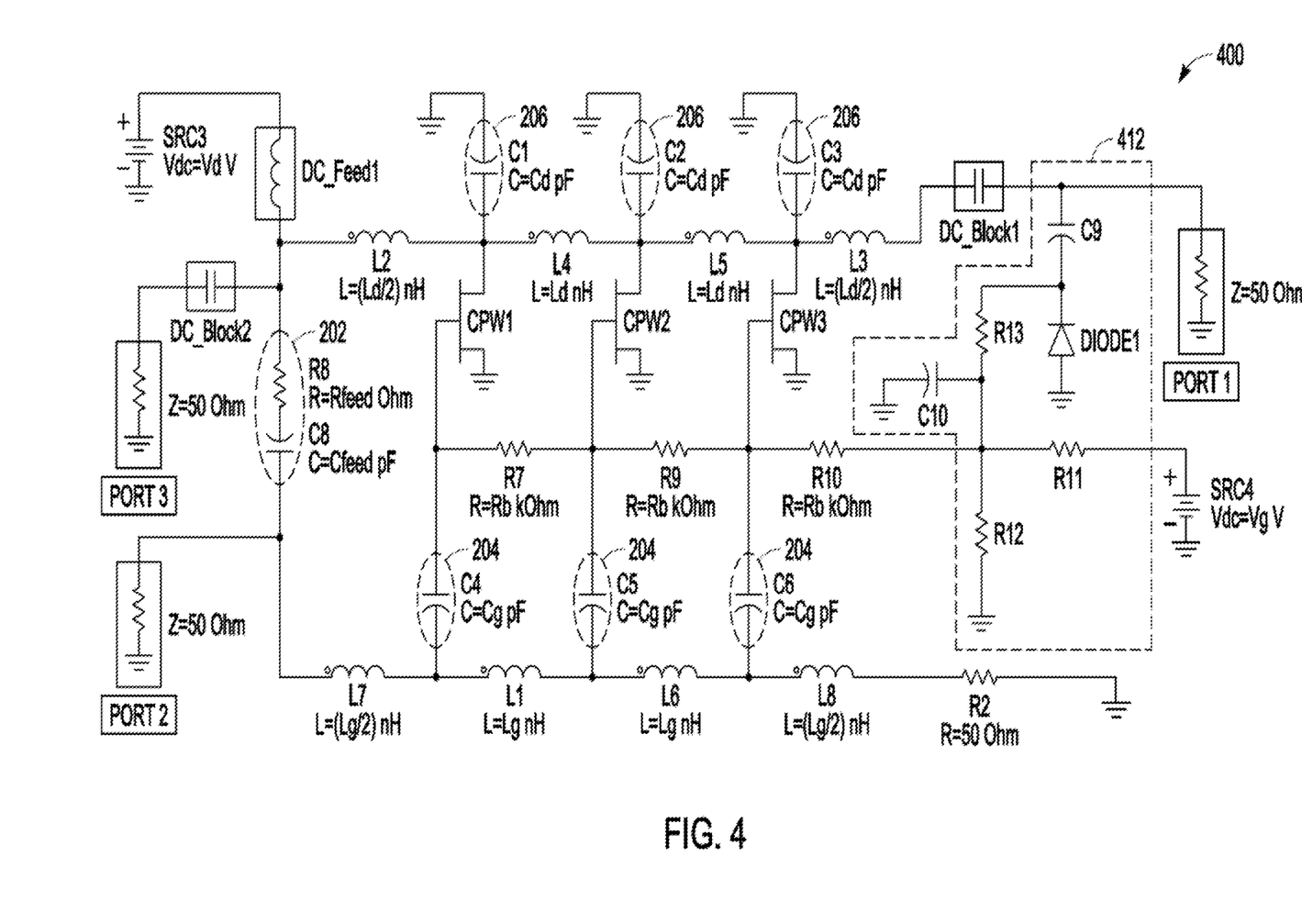
FIG. 4 is a circuit schematic of another example of an active balun circuit.

FIG. 4 is a circuit schematic of another example of an active balun circuit 400. The circuit in FIG. 4 is the same circuit topology as the active balun circuit 200 of FIG. 2 and is used to convert a balanced signal received at Ports 2 and 3 to an unbalanced signal at Port 1. The active balun circuit 400 of FIG. 4 includes a power coupling circuit 412 that rectifies the radio frequency (RF) output signal at Port 1 and couples the power of the output to DC. This can reduce the overall power used to operate the circuit 400. The recycling of output power can lead to a lower biasing point for the active devices. In some examples, the circuit 400 includes a power detector circuit that detects the amount of output power coupled to DC and a biasing control circuit that adjusts the biasing of the active devices according to the detected power.

Figure 5:
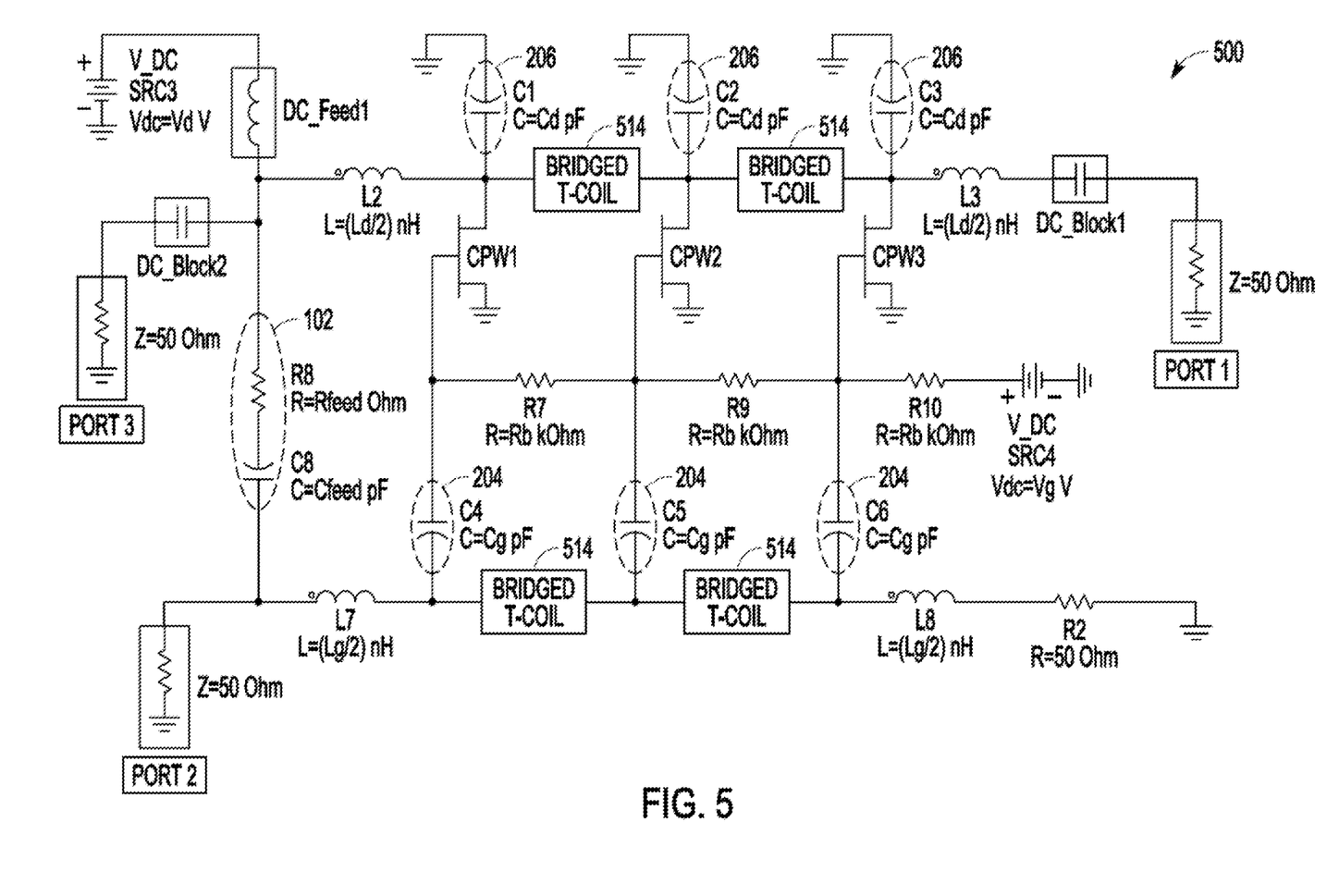
FIG. 5 is a circuit schematic of another example of an active balun circuit.
Figure 6:
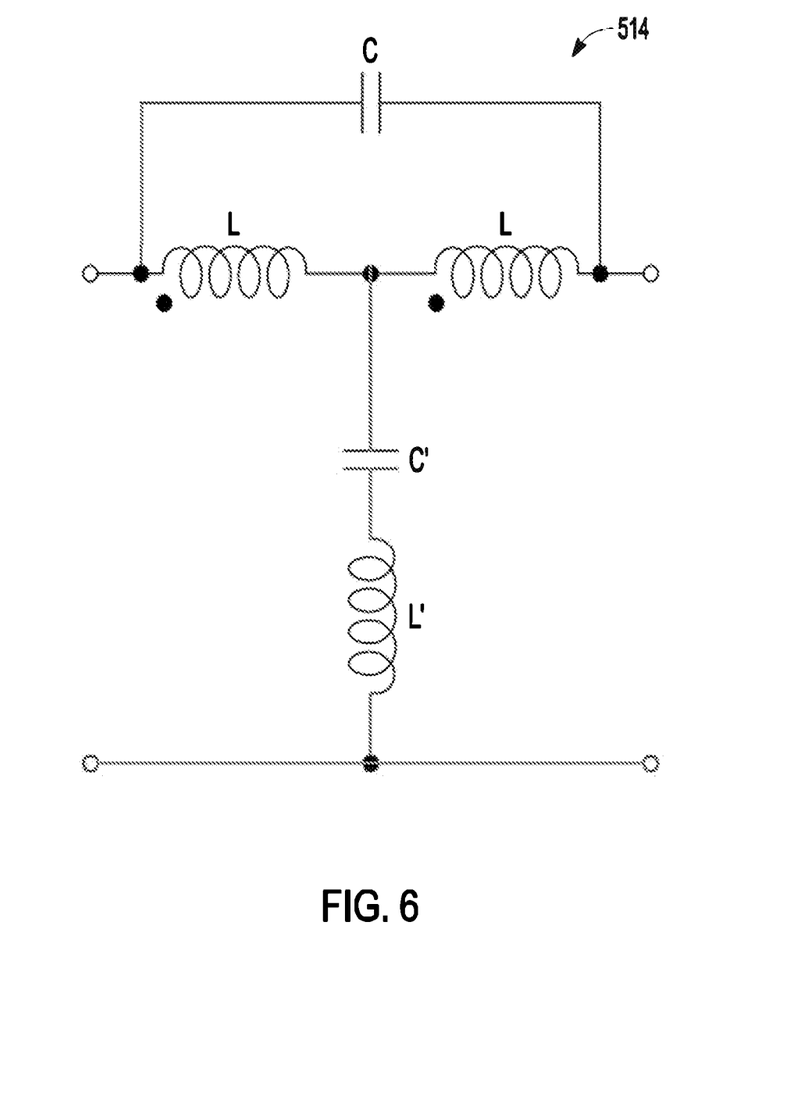
FIG. 6 is a circuit schematic of an example of a bridged T-coil transmission line.

FIG. 5 is a circuit schematic of another example of an active balun circuit 500. The active balun circuit 500 has the same circuit topology as the active balun circuit 200 of FIG. 2 and is used to convert a balanced signal received at Ports 2 and 3 to an unbalanced signal at Port 1. In the circuit of FIG. 5, sections of the input transmission line and output transmission line are replaced with bridged T-coil transmission lines 514. FIG. 6 is a circuit schematic of an example of a bridged T-coil transmission line 514 that can be used in the active balun circuit 500 of FIG. 5. Compared to the circuit example of FIG. 2, using bridged T-coil transmission lines 514 in the input transmission line and output transmission line as shown in FIG. 5 extends the frequency range of the circuit 500 at the higher frequency end.

Figure 7:
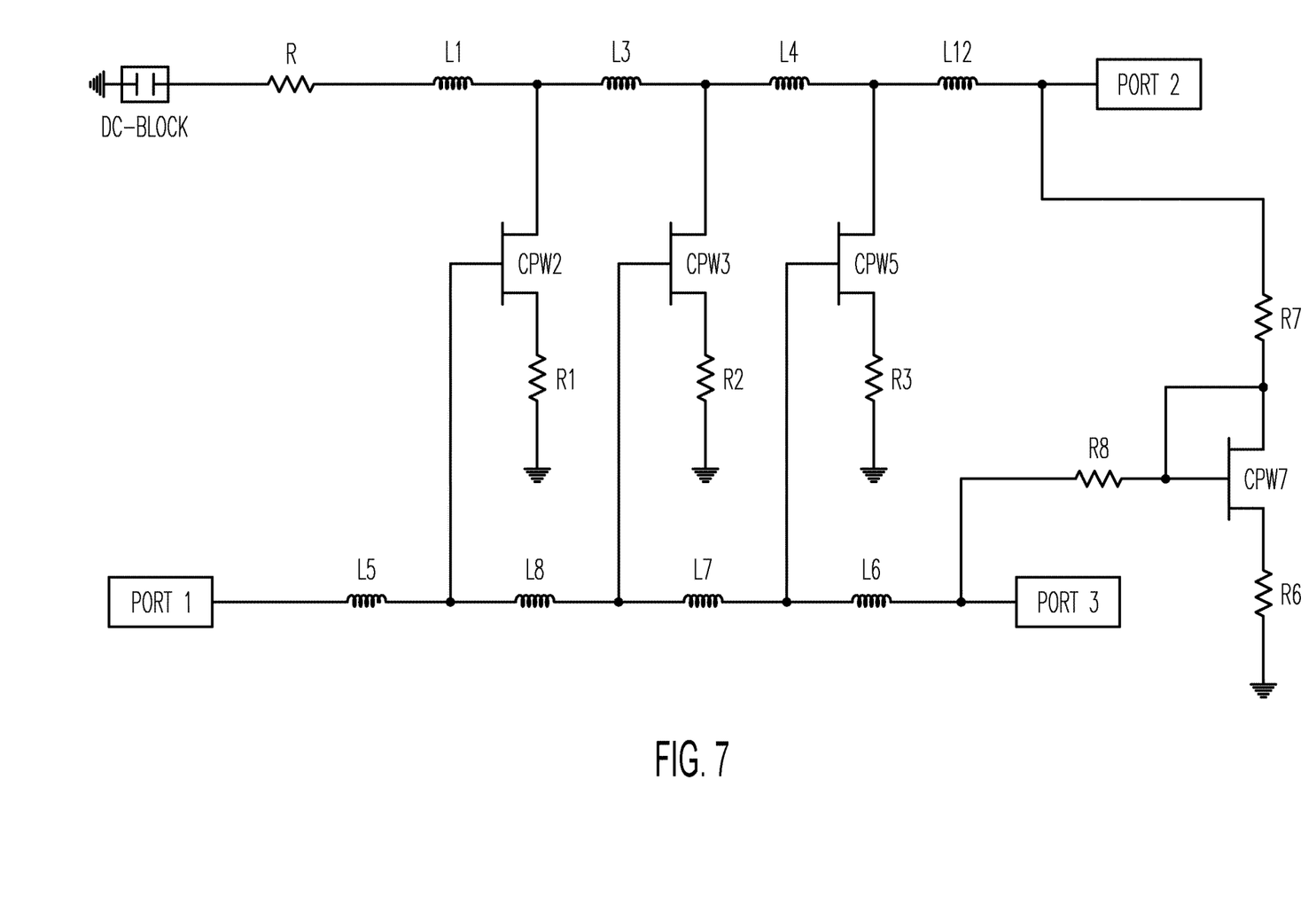
FIG. 7 is a circuit schematic of an example of an active balun circuit.

FIG. 7 is a circuit schematic of another example of an active balun circuit 700. The active balun circuit 700 has the same circuit topology as the active balun circuit 200 of FIG. 2 and is used to convert an unbalanced signal received at Port 1 to a balanced differential signal at Ports 2 and 3. But instead of using the serial capacitors and resistors connected to the gate terminals of the FETs (or base terminal of HBTs) as in FIG. 1, the circuit 700 of FIG. 7 includes a resistor (R1, R2, R3) connected to the source terminal of each FET (or the emitter terminal of each HBT).

Figure 8:
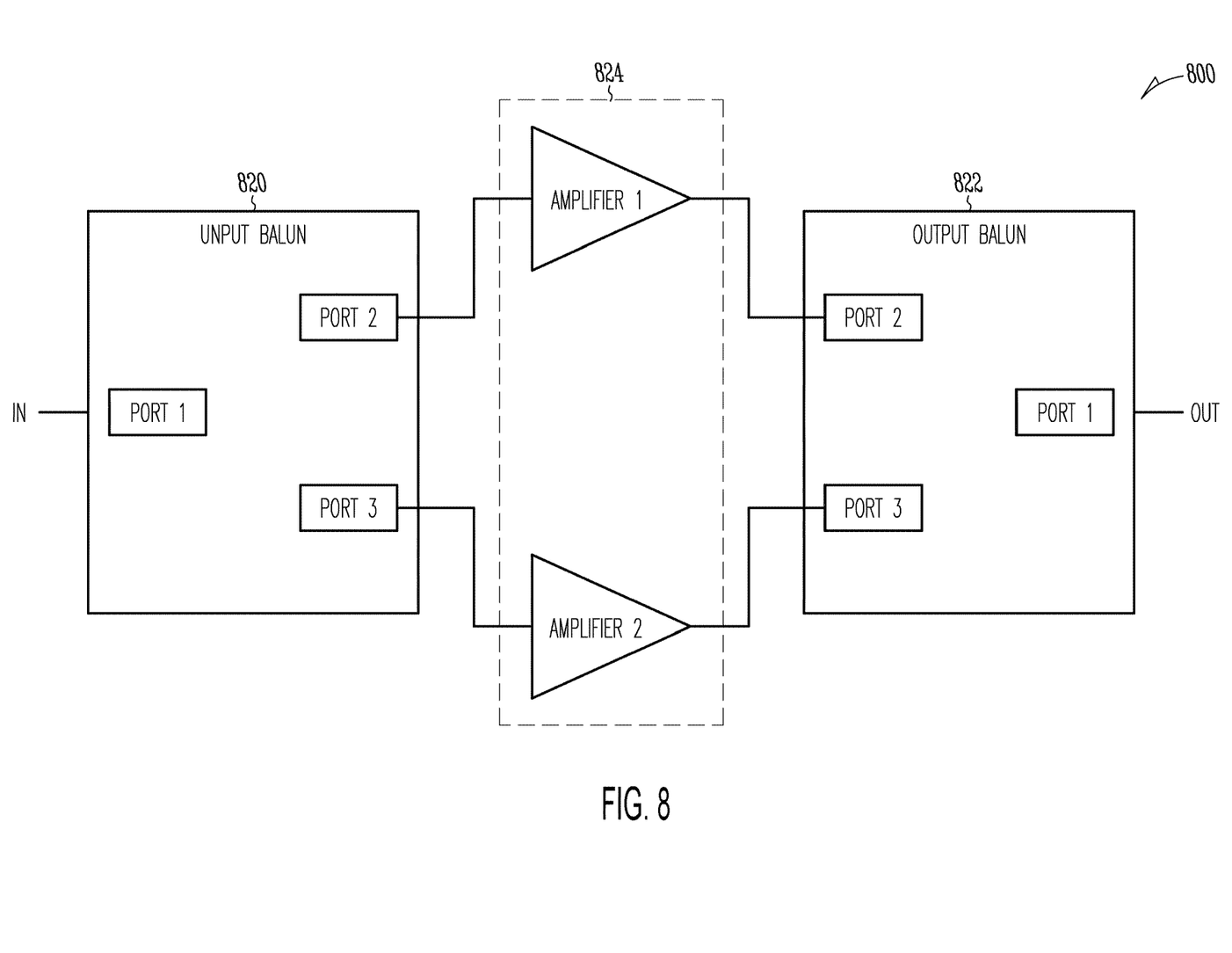
FIG. 8 shows an example of an input balun and an output balun connected to a differential amplifier.

FIG. 8 shows an example of a circuit 800 an input balun 820 and an output balun 822 connected to a differential amplifier 824. The input balun 820 can be either of the active balun circuits included in FIG. 1 or FIG. 7. The output balun 822 can be either of the active balun circuits included in FIGS. 2-5. The circuit of FIG. 8 may convert an unbalanced signal received the input (IN) to a balanced differential signal provided to differential amplifier 824, and convert a balanced differential signal from the differential amplifier 824 to an unbalanced signal at the output (OUT).

The active balun circuit examples described herein improved balun performance without the need for preamplifier, thereby reducing the size of the active baluns. The active balun circuit examples described have three circuit sections. Additional circuit sections can be added to improve performance. Also, the circuit examples show a 50 Ohm impedance at the balanced terminals and a 50 Ohm impedance at the unbalanced terminals. Other terminal impedances can be used in the circuit examples (e.g., 100 Ohms, etc.). Other terminals may be a different ratio than one-to-one. For example, an active balun circuit may convert a 50 ohm unbalanced signal to 100 Ohm balanced differential signal or a 100 Ohm unbalanced signal to 50 Ohm balanced differential signal.

ADDITIONAL DESCRIPTION AND EXAMPLES

Example 1 includes subject matter (such as a balun circuit) comprising a plurality of transistors, an output transmission line connected to output terminals of the transistors, an input transmission line, and a plurality of serial capacitors coupled to input terminals of the transistors and the input transmission line.

In Example 2, the subject matter of Example 1 optionally includes a plurality of shunt capacitors, and each shunt capacitor is connected between an output terminal of a transistor to circuit ground.

In Example 3, the subject matter of one or both of Examples 1 and 2 optionally includes a resistive-capacitive (RC) feedback path, the RC feedback path including a resistor and a capacitor connected in series between the input transmission line and the output transmission line.

In Example 4, the subject matter of one or any combination of Examples 1-3 optionally includes a first port connected to an end of the input transmission line, a second port connected to the output transmission line, a third port connected to a different end of the input transmission line than the first port, and the balun circuit converts an unbalanced signal received at the first port to a balanced signal at the second and third ports.

In example 5, the subject matter of one or any combination of Examples 1-3 optionally includes a first port connected to an end of the input transmission line, a second port connected to the output transmission line, a third port connected to a different end of the input transmission line than the first port, and the balun circuit converts a balanced signal received at the second and third ports to an unbalanced signal at the first port.

In Example 6, the subject matter of one or any combination of Examples 1-5 optionally includes a power coupling circuit connected to the first port.

In Example 7, the subject matter of one or any combination of Examples 1-6 optionally includes at least one of the input transmission line and the output transmission line including a bridged T-coil transmission line.

In Example 8, the subject matter of one or any combination of Examples 1-7 optionally includes a plurality of transistors that includes a plurality of cascode structures. Each cascode structure includes two cascode connected field effect transistors (FETs), wherein the output transmission line is connected to a drain terminal of a first FET of the cascode structure, and a serial capacitor is connected to a gate terminal of the second FET of the cascode structure.

In Example 9, the subject matter of Example 8 optionally includes an inductor connected to a source terminal of the first FET of the cascode structure and to a drain terminal of the second FET of the cascode structure.

In Example 10, the subject matter of one or both of Examples 8 and 9 optionally includes a plurality of inductor-capacitor (LC) circuits, each LC circuit connected to a gate terminal of the first FET of the cascode structure.

Example 11 includes subject matter (such as an electronic device) or can optionally be combined with one or any combination of Examples 1-10 to include such subject matter, comprising a balun circuit including a first integrated circuit (IC). The first IC includes an input transmission line, an output transmission line, a plurality of transistors in which each transistor includes a first output terminal connected to the output transmission line, a plurality of shunt capacitors in which each shunt capacitor is coupled to the output terminal of the transistors and circuit ground, and a plurality of serial capacitors coupled to input terminals of the transistors and the input transmission line.

In Example 12, the subject matter of Example 11 optionally includes a DC blocking capacitor connected to each end of the output transmission line, and a Direct Current (DC) bias inductor connected to the output transmission lone and a DC circuit supply.

In Example 13, the subject matter of Example 12 optionally includes the DC blocking capacitors and the DC bias inductor being included in a second IC.

In Example 14, the subject matter of one or both of Examples 12 and 13 optionally includes the first IC including a resistive-capacitive (RC) feedback path, the RC feedback path including a resistor and a capacitor connected in series between the input transmission line and the output transmission line.

In Example 15, the subject matter of one or any combination of Examples 12-14 optionally includes a first port connected to an end of the input transmission line, a DC blocking capacitor connected to the output transmission line, a second port connected to the DC blocking capacitor, a third port connected to a different end of the input transmission line than the first port, and the balun circuit converts an unbalanced signal received at the first port to a balanced signal at the second and third ports.

In Example 16, the subject matter of one or any combination of Examples 12-14 optionally includes a first port connected to an end of the input transmission line, a second port connected to the output transmission line, a third port connected to a different end of the input transmission line than the first port, and the balun circuit converts a balanced signal received at the second and third ports to an unbalanced signal at the first port.

In Example 17, the subject matter of one or any combination of Examples 12-16 optionally includes a plurality of transistors that includes a plurality of cascode structures, wherein each cascode structure includes two cascode connected field effect transistors (FETs), wherein the output transmission line is connected to a drain terminal of a first FET of the cascode structure, and a serial capacitor is connected to a gate terminal of the second FET of the cascode structure.

Example 18 includes subject matter (such as an electronic device) or can optionally be combined with one or any combination of Examples 1-17 to include such subject matter, comprising a balun circuit including a first integrated circuit (IC). The first IC includes an input transmission line, an output transmission line, a plurality of transistors and each transistor includes a first output terminal connected to the output transmission line and a control terminal coupled to the input transmission line, a plurality of resistors and each resistor is coupled to a second output terminal of the transistors and circuit ground, a first port connected to an end of the input transmission line, a second port connected to the output transmission line, and a third port connected to a different end of the input transmission line than the first port. The balun circuit converts a balanced signal received at the second and third ports to an unbalanced signal at the first port.

In Example 19, the subject matter of Example 18 optionally includes a plurality of transistors that includes a plurality of field effect transistors (FETs) each including a gate terminal, a source terminal, and a drain terminal, and the gate terminals of the FETs are connected to the input transmission line.

In Example 20, the subject matter of Example 18 optionally includes a plurality of transistors includes a plurality of heterojunction bipolar transistors (HBTs) each including a base terminal, a collector terminal, and an emitter terminal, and the base terminals of the HBTs are connected to the input transmission line.

These non-limiting Examples can be combined in any permutation of combinations. The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in a claim are still deemed to fall within the scope of that claim. Moreover, in the following aspects, the terms "first," "second," and "third," etc., are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A balun circuit comprising:
   a plurality of transistors;
   an output transmission line connected to output terminals of the transistors;
   an input transmission line;
   a plurality of serial capacitors coupled to input terminals of the transistors and the input transmission line; and
   a resistive-capacitive (RC) feedback path, the RC feedback path including a resistor and a capacitor connected in series between the input transmission line and the output transmission line.

2. The balun circuit of claim 1, including a plurality of shunt capacitors, wherein each shunt capacitor is connected between an output terminal of a transistor of the plurality of transistors to circuit ground.

3. The balun circuit of claim 1, including:
   a first port connected to an end of the input transmission line;
   a second port connected to the output transmission line;
   a third port connected to a different end of the input transmission line than the first port; and
   wherein the balun circuit converts an unbalanced signal received at the first port to a balanced signal at the second and third ports.

4. The balun circuit of claim 1, including:
   a first port connected to an end of the output transmission line;
   a second port connected to the input transmission line;
   a third port connected to a different end of the output transmission line than the first port; and
   wherein the balun circuit converts a balanced signal received at the second and third ports to an unbalanced signal at the first port.

5. The balun circuit of claim 4, including a power coupling circuit connected to the first port.

6. The balun circuit of claim 1, wherein at least one of the input transmission line and the output transmission line includes a bridged T-coil transmission line.

7. The balun circuit of claim 1, wherein the plurality of transistors includes a plurality of cascode structures including, each cascode structure includes two cascode connected field effect transistors (FETs), wherein the output transmission line is connected to a drain terminal of a first FET of the cascode structure and a serial capacitor is connected to a gate terminal of the second FET of the cascode structure.

8. The balun circuit of claim 7, including an inductor connected to a source terminal of the first FET of the cascode structure and to a drain terminal of the second FET of the cascode structure.

9. The balun circuit of claim 7, including a plurality of inductor-capacitor (LC) circuits, each LC circuit connected to a gate terminal of the first FET of the cascode structure.

10. An electronic device comprising:
    a balun circuit including a first integrated circuit (IC) including:
    an input transmission line;
    an output transmission line;
    a plurality of transistors, each transistor including an output terminal connected to the output transmission line;

a plurality of shunt capacitors, each shunt capacitor coupled to the output terminal of the transistors and circuit ground; and a plurality of serial capacitors coupled to input terminals of the transistors and the input transmission line first and second DC blocking capacitors each connected to a different end of the output transmission line; and a Direct Current (DC) bias inductor connected to the output transmission line and a DC circuit supply.

11. The electronic device of claim 10, wherein the first and second DC blocking capacitors and the DC bias inductor are included in a second IC.

12. The electronic device of claim 10, wherein the first IC includes a resistive-capacitive (RC) feedback path, the RC feedback path including a resistor and a capacitor connected in series between the input transmission line and the output transmission line.

13. The electronic device of claim 10, including:
a first port connected to an end of the input transmission line;
a second port connected to one of the first and second DC blocking capacitors;
a third port connected to a different end of the input transmission line than the first port; and
wherein the balun circuit converts an unbalanced signal received at the first port to a balanced signal at the second and third ports.

14. The electronic device of claim 10, including:
a first port connected to an end of the output transmission line;
a second port connected to the input transmission line;
a third port connected to a different end of the output transmission line than the first port; and
wherein the balun circuit converts a balanced signal received at the second and third ports to an unbalanced signal at the first port.

15. The electronic device of claim 10, wherein the plurality of transistors includes a plurality of cascode structures, wherein each cascode structure includes two cascode connected field effect transistors (FETs), wherein the output transmission line is connected to a drain terminal of a first FET of the cascode structure, and a serial capacitor is connected to a gate terminal of the second FET of the cascode structure.

16. An electronic device comprising:
a balun circuit including a first integrated circuit (IC) including:
an input transmission line;
an output transmission line;
a plurality of transistors, each transistor including a first output terminal connected to the output transmission line, and a control terminal coupled to the input transmission line;
a plurality of resistors, each resistor coupled to a second output terminal of the transistors and circuit ground;
a first port connected to an end of the output transmission line;
a second port connected to the input transmission line;
a third port connected to a different end of the output transmission line than the first port; and
wherein the balun circuit converts a balanced signal received at the second and third ports to an unbalanced signal at the first port.

17. The electronic device of claim 16,
wherein the plurality of transistors includes a plurality of field effect transistors (FETs) each including a gate terminal, a source terminal, and a drain terminal; and
wherein the gate terminals of the FETs are connected to the input transmission line.

18. The electronic device of claim 16,
wherein the plurality of transistors includes a plurality of heterojunction bipolar transistors (HBTs) each including a base terminal, a collector terminal, and an emitter terminal; and
wherein the base terminals of the HBTs are connected to the input transmission line.

\* \* \* \* \*